(12) United States Patent
Sooriakumar et al.

(10) Patent No.: US 10,488,288 B2
(45) Date of Patent: Nov. 26, 2019

(54) CAPACITIVE PRESSURE SENSOR

(71) Applicants: Kathirgamasundaram Sooriakumar, Rochester, NY (US); Anu Austin, Lengkong Tiga (SG); Ian Rose Bihag, Cebu (PH); Dieter Naegele-Preissmann, Ingelheim am Rhein (DE)

(72) Inventors: Kathirgamasundaram Sooriakumar, Rochester, NY (US); Anu Austin, Lengkong Tiga (SG); Ian Rose Bihag, Cebu (PH); Dieter Naegele-Preissmann, Ingelheim am Rhein (DE)

(*) Notice: Subject to any disclaimer, the term of this patent is extended or adjusted under 35 U.S.C. 154(b) by 266 days.

(21) Appl. No.: 15/439,659

(22) Filed: Feb. 22, 2017

(65) Prior Publication Data
US 2017/0241854 A1 Aug. 24, 2017

Related U.S. Application Data

(60) Provisional application No. 62/298,235, filed on Feb. 22, 2016.

(51) Int. Cl.
*G01L 9/00* (2006.01)
*H05K 1/18* (2006.01)
*H05K 3/40* (2006.01)
*H05K 3/46* (2006.01)

(52) U.S. Cl.
CPC ............. *G01L 9/0073* (2013.01); *H05K 1/18* (2013.01); *H05K 3/4038* (2013.01); *H05K 3/4644* (2013.01); *H05K 2201/10151* (2013.01)

(58) Field of Classification Search
CPC ...... G01L 9/0073; H05K 1/18; H05K 5/4038; H05K 5/4644; H05K 2201/10151
See application file for complete search history.

(56) References Cited

U.S. PATENT DOCUMENTS

| | | | | |
|---|---|---|---|---|
| 5,178,015 | A * | 1/1993 | Loeppert | G01L 9/0042 29/25.41 |
| 5,209,118 | A * | 5/1993 | Jerman | G01L 9/0042 73/715 |
| 5,888,845 | A * | 3/1999 | Bashir | B81C 1/00158 438/53 |
| 6,012,335 | A * | 1/2000 | Bashir | B81C 1/00158 73/724 |
| 6,132,513 | A * | 10/2000 | Kadkhodayan | G01L 9/0042 118/715 |
| 7,265,429 | B2 * | 9/2007 | Wan | B81C 1/00095 257/415 |
| 7,644,622 | B2 * | 1/2010 | Qiao | G01L 9/0016 73/702 |
| 8,316,718 | B2 * | 11/2012 | Lin | G01L 9/0073 438/50 |

(Continued)

*Primary Examiner* — Jonathan M Dunlap
(74) *Attorney, Agent, or Firm* — Cozen O'Connor

(57) ABSTRACT

Aspects of the disclosure provide a capacitive pressure sensor. The sensor can include a first substrate having a first surface and a second surface, a movable plate at a bottom of a first cavity recessed into the substrate from the first surface, and a second substrate bonded to the first substrate over the first surface. The second substrate includes a fixed plate disposed over the movable plate to form a capacitor. A second cavity is formed between the movable plate and the second surface.

14 Claims, 16 Drawing Sheets

(56) References Cited

U.S. PATENT DOCUMENTS

| | | | | |
|---|---|---|---|---|
| 8,590,387 | B2* | 11/2013 | Crivelli | G01L 9/0073 |
| | | | | 73/724 |
| 9,170,164 | B2 | 10/2015 | Naegele-Preissmann et al. | |
| 9,518,877 | B2* | 12/2016 | Weber | G01L 1/148 |
| 10,006,824 | B2* | 6/2018 | Tsai | H04R 19/005 |
| 2001/0020320 | A1* | 9/2001 | McIntosh | B81B 3/0086 |
| | | | | 29/25.41 |
| 2001/0047689 | A1* | 12/2001 | McIntosh | B81B 3/0086 |
| | | | | 73/514.32 |
| 2009/0166772 | A1* | 7/2009 | Hsieh | B81C 1/00182 |
| | | | | 257/415 |
| 2009/0218642 | A1* | 9/2009 | Miller | B81C 1/00182 |
| | | | | 257/416 |
| 2010/0052082 | A1* | 3/2010 | Lee | B81B 7/0061 |
| | | | | 257/416 |
| 2011/0126632 | A1* | 6/2011 | McNeil | B81B 7/02 |
| | | | | 73/718 |
| 2012/0247218 | A1* | 10/2012 | Crivelli | G01L 9/0073 |
| | | | | 73/724 |
| 2014/0374858 | A1* | 12/2014 | Naegele-Preissmann | |
| | | | | G01L 1/148 |
| | | | | 257/419 |
| 2015/0014797 | A1* | 1/2015 | Schelling | B81B 3/0059 |
| | | | | 257/416 |
| 2015/0260598 | A1* | 9/2015 | Getman | G01L 9/0073 |
| | | | | 73/861.42 |
| 2016/0103031 | A1* | 4/2016 | Tham | B33Y 70/00 |
| | | | | 73/724 |
| 2017/0146416 | A1* | 5/2017 | Teipen | G01L 13/025 |

* cited by examiner

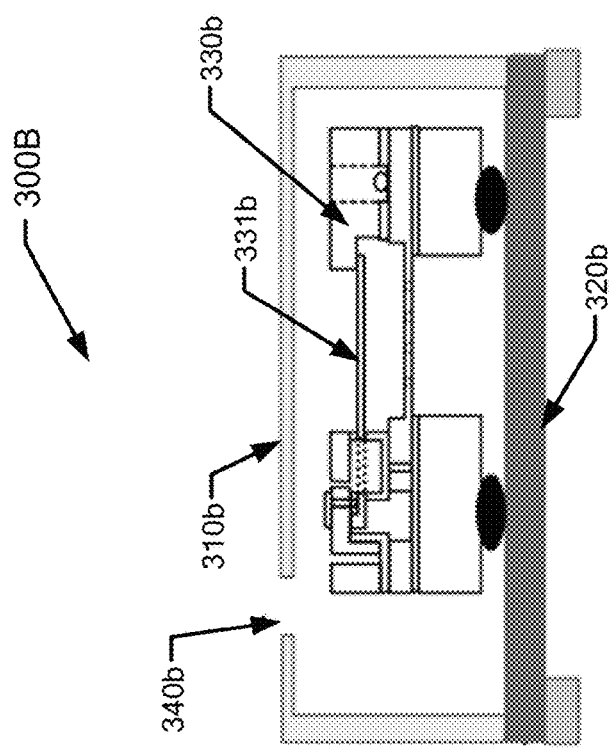
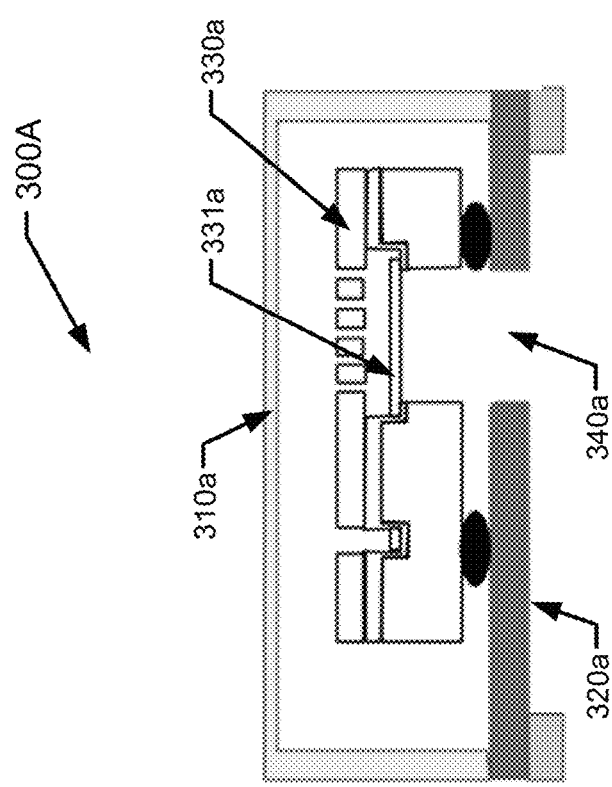

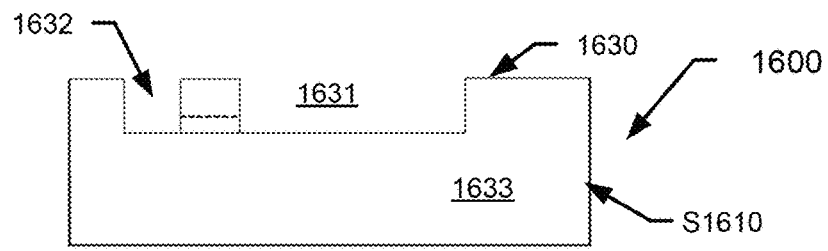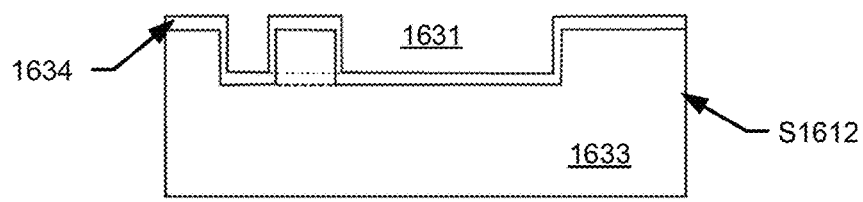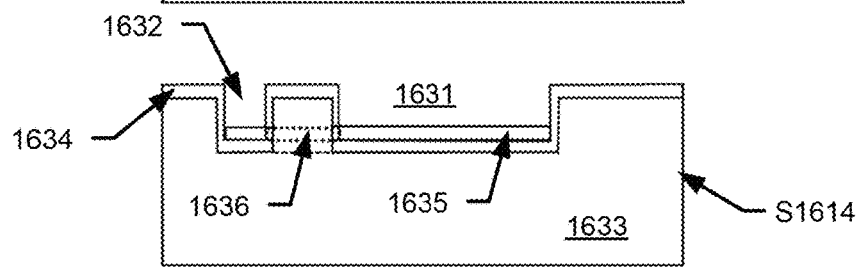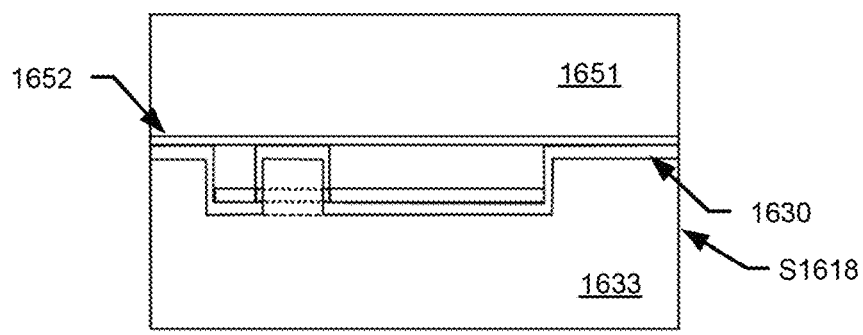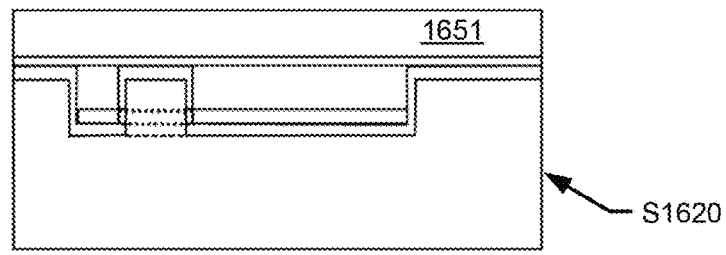
*Fig. 16A*

CAPACITIVE PRESSURE SENSOR

INCORPORATION BY REFERENCE

This present disclosure claims the benefit of U.S. Provisional Application No. 62/298,235, "Unique Design and Fabrication Sequence of Making Low Cost Capacitive Pressure Sensor with Higher Performance", filed on Feb. 22, 2016, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Capacitive pressure sensors can be used for measuring low and ultra-low pressure in a range of a few pascals in many applications. Capacitive pressure sensors are commonly used in, but not limited to, dry air pressure measurement such as sound pressure measurement. There is a need for further optimizing functionality and performance of capacitive pressure sensors while ensuring a competitive manufacturing cost.

SUMMARY

Aspects of the disclosure provide a capacitive pressure sensor. The sensor can include a first substrate having a first surface and a second surface, a movable plate at a bottom of a first cavity recessed into the substrate from the first surface, and a second substrate bonded to the first substrate over the first surface. The second substrate includes a fixed plate disposed over the movable plate to form a capacitor. A second cavity is formed between the movable plate and the second surface.

In one example, the fixed plate has a contoured surface facing the movable plate. The contoured surface follows a deflection contour of the movable plate. In another example, the movable plate is contoured and concaves in a direction away from the fixed plate. In a further example, the movable plate includes a spring structure near an edge of the movable plate.

In one example, the capacitive pressure sensor further includes an isolation layer at a bonding interface between the first substrate and the second substrate. In another example, the capacitive pressure sensor further includes a ventilation path going through the first substrate and the second substrate. The ventilation path includes a first opening at a sidewall of the second cavity and a second opening at a surface of the second substrate opposite to a bonding interface between the first and second substrates.

In one example, the capacitive pressure sensor further includes a package substrate including an opening, and a cap attached to the package substrate enclosing the first substrate and the second substrate. The first substrate is attached to the package substrate at the second surface of the first substrate with the second cavity over the opening.

Aspects of the disclosure provide a process for fabricating a capacitive pressure sensor. The process can include forming a first cavity recessed into a first substrate from a first surface of the first substrate, forming a first isolation layer over the first surface of the first substrate and a surface of the first cavity, forming a diaphragm layer at the bottom of the first cavity over the first isolation layer, and bonding a second substrate to the first substrate over the first surface of the first substrate.

In one example, the process can further include reducing the second substrate, forming damping holes in the second substrate over the first cavity, forming a second cavity in the first substrate between the first isolation layer and a second surface of the first substrate, and removing a portion of the first isolation layer between the diaphragm layer and the second cavity. The process can further includes forming a second isolation layer over a bonding surface of the second substrate before bonding the second substrate with the first substrate, and removing a portion of the second isolation layer above the first cavity after forming the second cavity.

In one example, the process includes attaching the first substrate to a package substrate at the second surface of the first substrate, wherein the package substrate has an opening disposed below the second cavity, and attaching a cap to the package substrate enclosing the first substrate and the second substrate In one example, fusion bonding is used to bond the second substrate to the first substrate. In one example, the diaphragm layer is constructed with silicon oxide or silicon carbide. In one example, the first substrate and/or the second substrate can be made from a prime wafer or a test wafer.

BRIEF DESCRIPTION OF THE DRAWINGS

Various embodiments of this disclosure that are proposed as examples will be described in detail with reference to the following figures, wherein like numerals reference like elements, and wherein:

FIGS. 3A-3B show a bottom-mount package and a top-mount package, respectively, according to some examples;

FIGS. 16A-16B show a fabricating process according to an example;

DETAILED DESCRIPTION OF EMBODIMENTS

Figure 1:
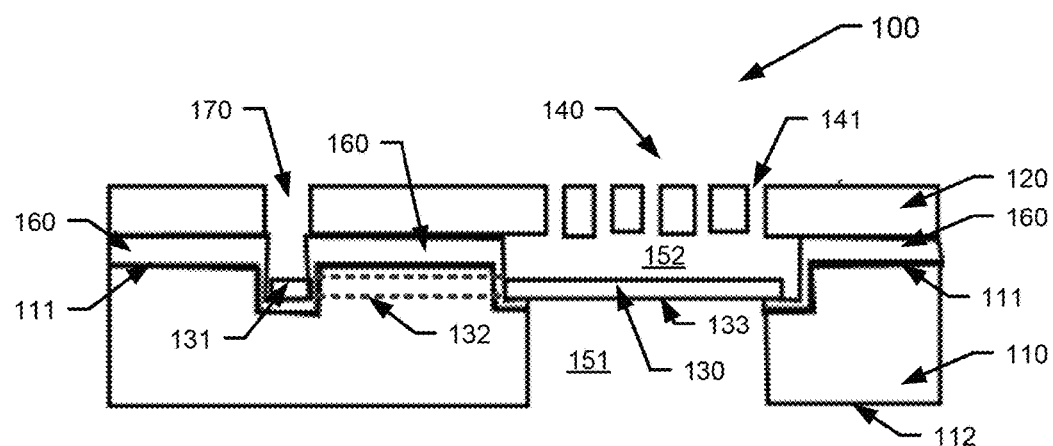
FIG. 1 shows an example capacitive pressure sensor according to an example of the disclosure.

FIG. 1 shows an example capacitive pressure sensor 100 according to an example of the disclosure. The capacitive pressure sensor 100 includes a first substrate 110, a second substrate 120. The first substrate 110 includes a first surface 111 and a second surface 112 opposite to the first surface. A thin film diaphragm 130, also referred to as a movable plate, is at a bottom of a cavity 152 recessed into the first substrate 110 from the first surface 111 of the first substrate 110. A chamber 151 is formed between the diaphragm 130 and the second surface 112 of the first substrate 110. The second substrate 120 is bonded to the first substrate 110. The second substrate 120 includes a fixed plate 140 disposed over the diaphragm 130 to form a capacitor. A gap 152 (the cavity 152) is formed between the fixed plate 140 and the diaphragm 130. The capacitive pressure sensor 100 further includes an isolation layer 160. The isolation layer 160 insulates the first substrate 110 from the second substrate 120 preventing electricity passing between the first and second substrate 110 and 120.

In one example, the first or second substrate 110 or 120 is made from a wafer including semiconductor materials, such as silicon, germanium, gallium arsenide (GaAs), and the like. In one example, the diaphragm 130 is formed by a thin polysilicon film doped with, for example, Phosphorus ions to make the diaphragm 130 conductive. In one example, thickness of the diaphragm 130 is in a range of 0.1-10 microns. Various suitable bonding techniques can be used for bonding the first and second substrates 110 and 120. In one example, fusion bonding technique is used. For example, a silicon dioxide layer can be used as an adhesive layer for the bonding operation. In another example, adhesive materials are used to bond the two substrates 110 and 120. Various suitable insulating materials can be used for insulating the first substrate 110 from the second substrate 120. In one example, the isolation layer 160 is formed by deposition of silicon dioxide.

In one example, the fixed plate 140 is perforated and includes a plurality of damping holes 141. In one example, the capacitive pressor sensor 100 includes a via hole 170 for interconnecting a portion 131 of the diaphragm 130 to an electrode (not shown) formed on the capacitive pressor sensor 100. The portion 131 of the diaphragm 131 is connected to other part of the diaphragm 130 through a channel structure 132.

In operation, a sound wave from a sound pressure port propagates through the chamber 151 reaching a sensing surface 133 of the diaphragm 130. The diaphragm 130 vibrates in response to a pressure exerted by the sound wave. The vibration leads to capacitance variation of the capacitor formed by the diaphragm 130 and the fixed plate 140. A current signal can thus be obtained from a circuit including the capacitor and is supplied as an output of the capacitive pressure sensor 100.

Figure 2:
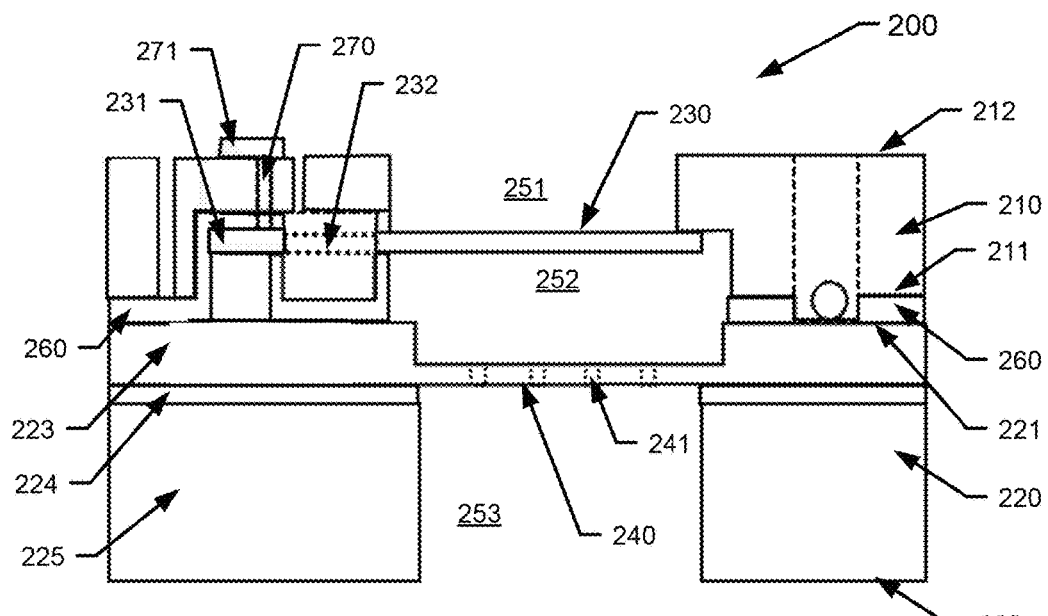
FIG. 2 shows another example capacitive pressure sensor according to an example of the disclosure.

FIG. 2 shows another example capacitive pressure sensor 200 according to an example of the disclosure. The capacitive pressure sensor 200 has a structure similar to that of the capacitive pressure sensor 100. However, the capacitive pressure sensor 100 is configured to be a bottom-mount sensor, while the capacitive pressure sensor 200 is configured to be a top-mount sensor, with respect to a package structure enclosing the respective capacitive pressure sensor. Bottom-mount pressure sensors or top-mount pressure sensors can be applicable for different applications. As an example, FIGS. 3A and 3B show a bottom-mount package 300A and a top-mount package 300B. Both packages 300A/300B include a package substrate 320a/320b, such as a print circuit board (PCB), and a cap 310a/310b. A sound pressure port 340a is formed in the package substrate 320a for the bottom-mount package 300A, while a sound pressure port 340b is formed in the cap 310b for the bottom-mount package 300B. The package 300A encloses a bottom-mount capacitive pressure sensor 330a having a diaphragm 331a facing downward, while the package 300B encloses a top-mount capacitive pressure sensor 330b having a diaphragm 331b facing upward.

In FIG. 2, the capacitive pressure sensor 200 includes a first substrate 210 and a second substrate 220. A diaphragm 230 (also referred to as a movable plate) is at a bottom of a cavity 252 recessed into the first substrate 210. The first substrate 210 includes a first surface 211 and a second surface 212. A chamber 251 (or cavity) is formed between the diaphragm 230 and the second face 212. The second substrate 220 includes a third surface 221 and a fourth surface 222. The second substrate 220 is bonded to the first substrate under the first surface 211 at the third surface 221. The second substrate 220 includes the fixed plate 240 disposed under the diaphragm 230 to form a capacitor. A gap 252 (the cavity 252) is formed between the fixed plate 240 and the diaphragm 230. An isolation layer 260 is formed between the first and second substrate 210 and 220 insulating the first substrate 210 from the second substrate 220. Similarly, suitable bonding techniques and insulating materials can be used for bonding or insulating the two substrates 210 and 220, respectively, in various examples.

In addition, a cavity 253 is formed between the fixed plate 240 and fourth surface 222. In one example, the second substrate 220 is made from a silicon on insulator wafer. Accordingly, in one example, the second substrate 220 includes a first silicon layer 223 made of prime quality silicon, an isolation layer 224 made of dioxide silicon, and a second silicon layer 225 made of bulk silicon. The fixed plate 240 is formed in the first silicon layer 224, while the cavity 253 is formed in the isolation layer 224 and the second silicon layer 225.

Similarly, in one example, the fixed plate 240 is perforated and includes a plurality of damping holes 241. In one example, the capacitive pressor sensor 200 includes a via hole 270 used from connecting a portion 231 of the diaphragm 230 to an electrode 271 formed on the second face of the capacitive pressor sensor 200. The portion 231 of the diaphragm 230 is connected to other part of the diaphragm 230 through a channel structure 232.

The capacitive pressure sensor 200 operates in a way similar to the capacitive pressure sensor 200. Description of operation of the capacitive pressure sensor 200 is omitted for simplicity.

The design and fabrication technology of the examples in FIGS. 1 and 2 are compatible to any complementary metal oxide semiconductor (CMOS) process. Thus, the capacitive pressure sensors 100 or 200 can be manufactured in large volume leading to competitive product cost. In addition, the design and fabrication technology of the examples in FIGS. 1 and 2 can be applicable for various sizes of sensor dies without altering any of design and fabrication concepts.

Figure 4:
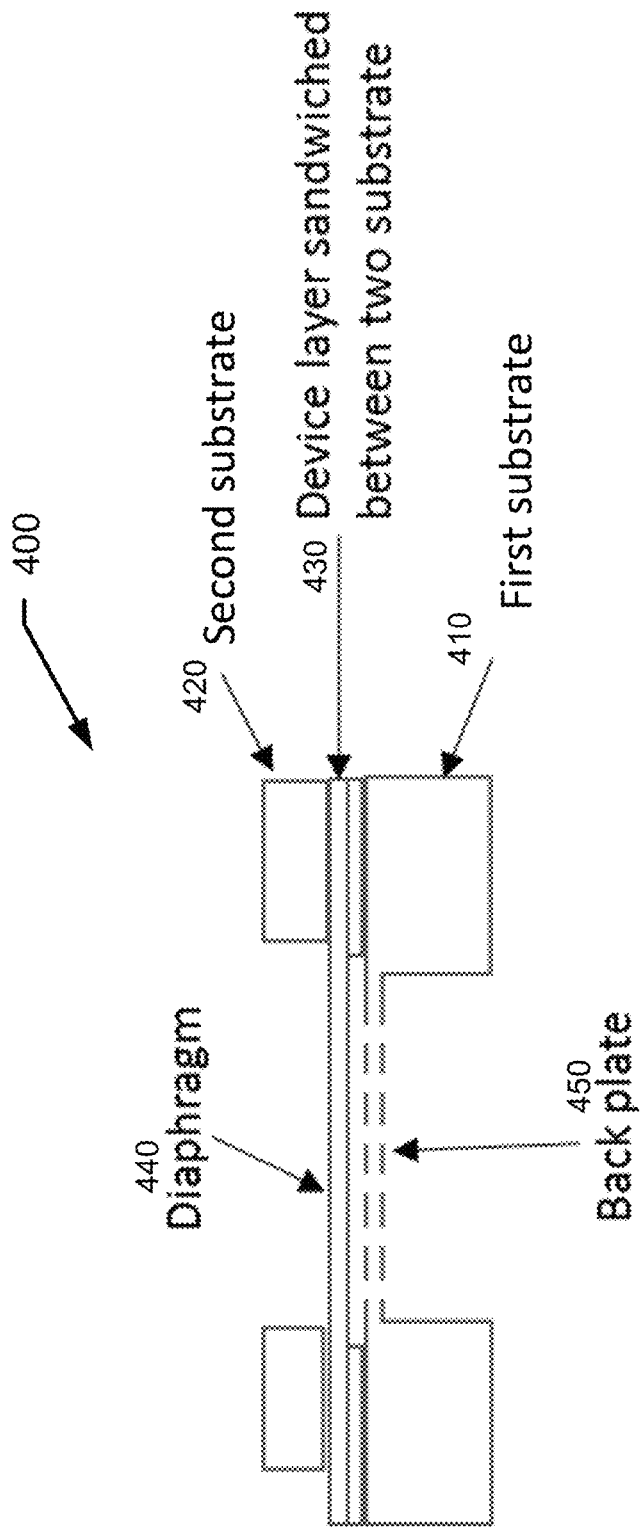
FIG. 4 shows a conventional capacitive pressure sensor.

According to an aspect of the disclosure, design of the capacitive pressure sensors 100 and 200 solves residual stress problems of a conventional capacitive pressure sensor design shown in FIG. 4. FIG. 4 shows a conventional capacitive pressure sensor 400. The capacitive pressure sensor 400 includes a first substrate 410, and a second substrate 420. A fixed plate 450 is formed at the first substrate 410. A diaphragm (movable plate) 440 is formed at a surface of the second substrate 420. For example, the diaphragm 440 can be formed within a device layer of a silicon on insulator (SOI) wafer. The first substrate 410 and the second substrate 420 are bonded together as shown in FIG. 4. The diaphragm 410 is sandwiched between the first and second substrates 410 and 420. Due to the bonding process while fabricating the capacitive pressure sensor 400, residual stresses can arise within the device layer that forms the diaphragm 440. The residual stresses can cause mechanical deformation of the diaphragm 440, such as warping or buckling, for example. The mechanical deformation can significantly affect performance of the capacitive pressure sensor 400, for example, reducing sensitivity of the capacitive pressure sensor 400.

In contrast, in examples of FIGS. 1 and 2, the diaphragm 130 or 230 are sitting inside a recessed cavity 152 or 252, respectively, and independent from bonding interface between two substrates, thus avoiding any stresses caused by operations of bonding two substrates.

In addition, due to the recessed-diaphragm structure in the examples of FIGS. 1 and 2, a complex bonding process for fabricating the conventional capacitive pressure sensor 400 can be avoided. In FIG. 4, the diaphragm 440 is typically made of polysilicon. However, the surface of a polysilicon layer is rough due to a deposition process, and thus a fine polishing process, for example, a chemical mechanical polishing process, is required before fusion bonding of the second substrate 420 to the first substrate 410. Additionally, it is difficult to fusion bond a polysilicon surface directly to another silicon or silicon oxide surface, and further processing processes are needed. In contrast, the diaphragm 130 or 230 is sitting inside a recessed cavity and independent from the bonding interface, and no poly silicon layer is formed at any bonding interface. Thus, the complex bonding processes can be avoided.

Figure 5:
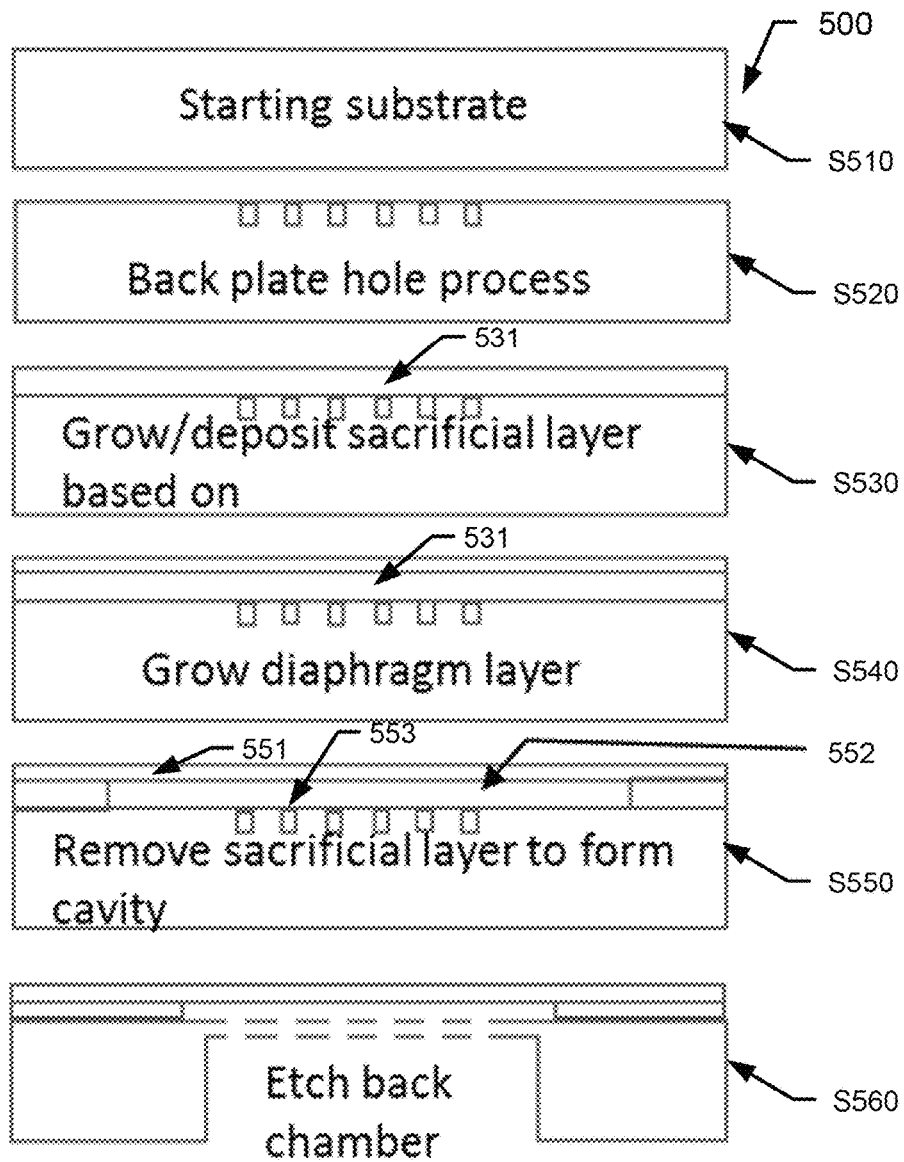
FIG. 5 shows a typical surface micromachining process for fabricating a conventional capacitive pressure sensor according to an example.

According to another aspect of the disclosure, the design of the capacitive pressure sensors 100 and 200 avoids stiction problems of another conventional capacitive pressure design. FIG. 5 shows a typical surface micromachining process 500 for fabricating a conventional capacitive pressure sensor. The surface micromachining process 500 includes a sequence of steps S510-S560. At S510, a substrate is provided. At S520, fixed (back) plate holes are formed. At S530, a sacrificial layer 531, for example, of silicon dioxide, is grown or deposited on the upper surface of the substrate. At S540, a diaphragm layer is grown over the sacrificial layer 531. At S550, the sacrificial layer 531 is removed to form a cavity 552 between a diaphragm 551 and a fixed plate 553. At S560, a back chamber is etched out below the fixed plate.

Figure 6:
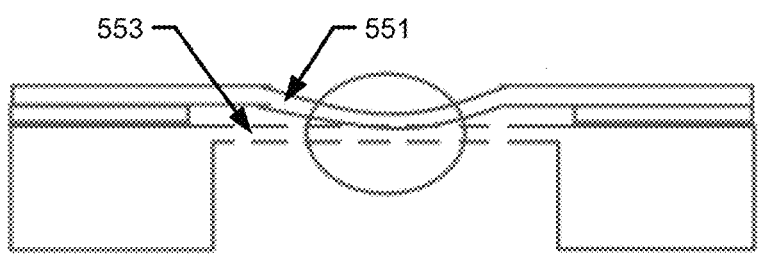
FIG. 6 shows a fabricating process where a diaphragm sticks to a fixed plate according to an example.

During S550, a wet etching process is performed to remove the sacrificial layer 531 to form the cavity 552, which may cause stiction problems. For example, after the wet etching process, deionized water can be used to rinse the device being fabricated to remove reminiscent chemicals. Since the gap between the fixed plate 553 and the diaphragm 551 is typically less than a few microns, for example, 4 microns, and thickness of the diaphragm 551 is also typically less than a few microns, for example, 2 microns, surface tension of water molecules may cause the diaphragm 551 to stick to the fixed plate 553 as shown in FIG. 6. In order to release the diaphragm from stiction, additional processes have to be performed, such as coating structure surface with surface anti-stiction mono-layer (SAM), using super critical carbon dioxide or vapor methanol to release the diaphragm, and the like. The fabricating process 500 is thus complicated.

Compared with the conventional capacitive pressure sensor design employing the fabricating process 500 in FIG. 5, the design of capacitive pressures sensors in FIGS. 1 and 2 simplifies the fabricating process. Specifically, in the examples of FIGS. 1 and 2, the diaphragm 130/230 and the cavity (gap) 152/252 can be formed prior to forming the fixed plate 140/240, thus avoiding any wet etching process for forming the diaphragm 551 in FIG. 5 as well as the stiction problems.

In addition, in the surface micromachining process 500, materials for forming the diaphragm 551 are limited to specific materials in order to satisfy requirements of the wet etching process employed. For example, the diaphragm layer in the process 500 should not react with wet etching chemicals used for remove the sacrificial layer 531. Therefore, only selected materials can be used for the diaphragm layer. In contrast, the designs of FIGS. 1 and 2 examples do not have the above diaphragm material limitation, and any thin film compatible with the design and respective fabricating process can be employed, such as polysilicon, silicon carbide, and the like.

Figure 7:
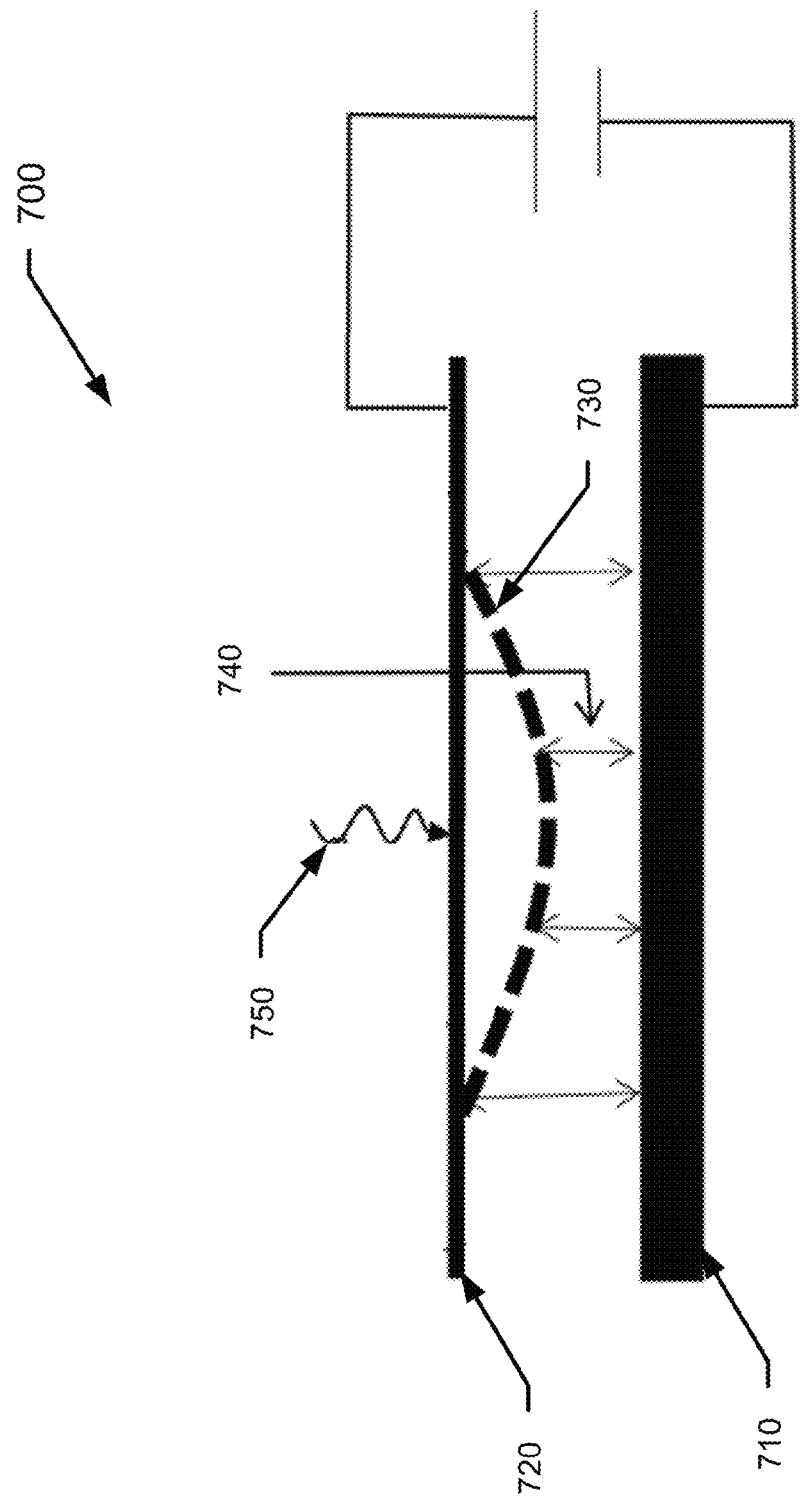
FIG. 7 shows a conventional capacitive pressure sensor according to an example.

FIG. 7 shows a conventional capacitive pressure sensor 700 according to an example. As shown, a fixed plate 710 and a diaphragm 720 are positioned in parallel, and gaps 740 between the fixed plate 710 and the diaphragm 720 are equal at different locations when no pressure is added to the diaphragm 720. The diaphragm 700 deflects in response to sound pressure 750 exerted on the diaphragm 700 forming a deflection contour 730. The deflection contour 730 is a surface convexing towards the fixed plate 710 and indicating a farthest position the diaphragm 720 can reach.

Figure 8:
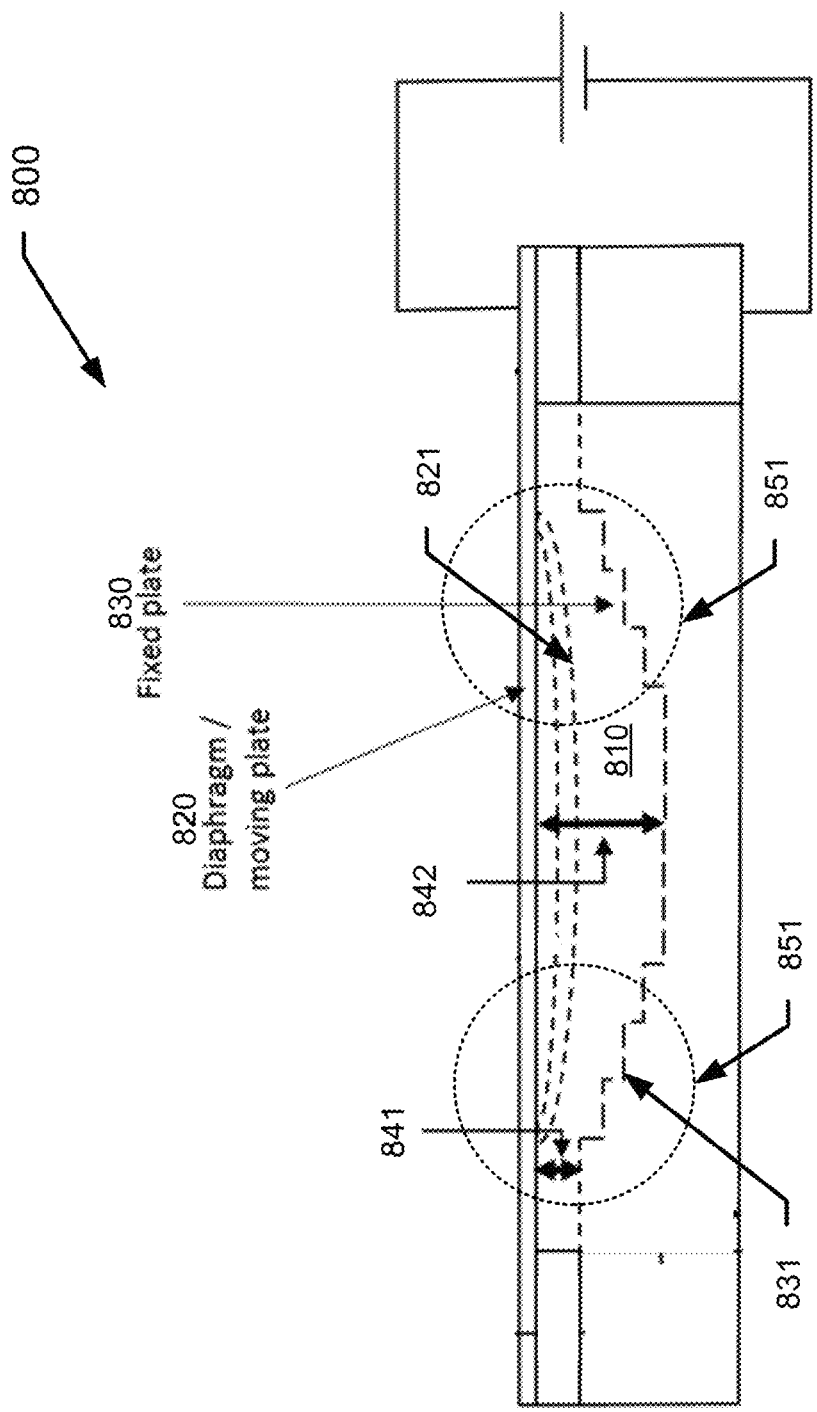
FIG. 8 shows an optimized capacitive pressure sensor according to an example of the disclosure.

FIG. 8 shows an optimized capacitive pressure sensor 800 according to an example of the disclosure. The capacitive pressure sensor 800 includes a diaphragm 820 that is flat when stationary and a contoured fixed plate 830 forming a capacitor for detecting pressure. The contoured fixed plate 830 includes a contoured surface 831 facing the diaphragm 820 but concaving in a direction away from the diaphragm 820. The contoured surface 831 follows a deflection contour 821 of the diaphragm 820. As a result, an optimized contoured cavity 810 is formed between a fixed plate 830 and a diaphragm 820 where a gap 841 near the edge of the diaphragm 820 is smaller than a gap 842 near the central region of the diaphragm 820.

The above feature of forming a contoured cavity between a fixed plate and a diaphragm in FIG. 8 has several advantages compared with the conventional parallel pate design shown in FIG. 7. First, the feature can increase sensitivity of a capacitive pressure sensor. For example, in capacitor of FIG. 8 example, regions 851 close to a periphery of the capacitor have smaller gaps compared with the central area of the capacitor having the gap 842. Accordingly, compared with a conventional capacitive pressure sensor including a plate fixed plate and having a gap equal to the gap 842, a same deformation of the diaphragm 820 would incur a higher variation of capacitance in the capacitive pressure sensor 800 than in the conventional capacitor. Thus, sensitivity of respective capacitive pressure sensor can be improved.

Second, the feature can increase capacitance of the capacitive pressure sensor 800 compared with a conventional pressure sensor having a pair of parallel plates. As is known, capacitance of a parallel capacitor is proportional to a distance between two plates of the capacitor. A capacitor with a contoured plate would have a larger capacitance that a capacitor having the same size but including a pair of paralleled plates assuming a maximum gap of the former equals a gap of the latter. Accordingly, a capacitive pressure sensor can maintain its capacitance while having a smaller size by implementing the above feature. Reduced die size leads to decreased cost for a capacitive pressure sensor.

Third, the feature can be used to decrease acoustic noise caused by leakage current through air gap of a capacitive pressure sensor. For example, air molecules collisions can create thermionic noise. Increasing distance between two plates in a capacitive pressure sensor can reduce occurrence of air molecules collisions thus decreasing the leakage current through the air gap. By implementing the contoured cavity technique, in FIG. 8 example, distance between plates at central part can be increased while maintaining a desired capacitance value, which helps to reduce acoustic noise.

Figure 9:
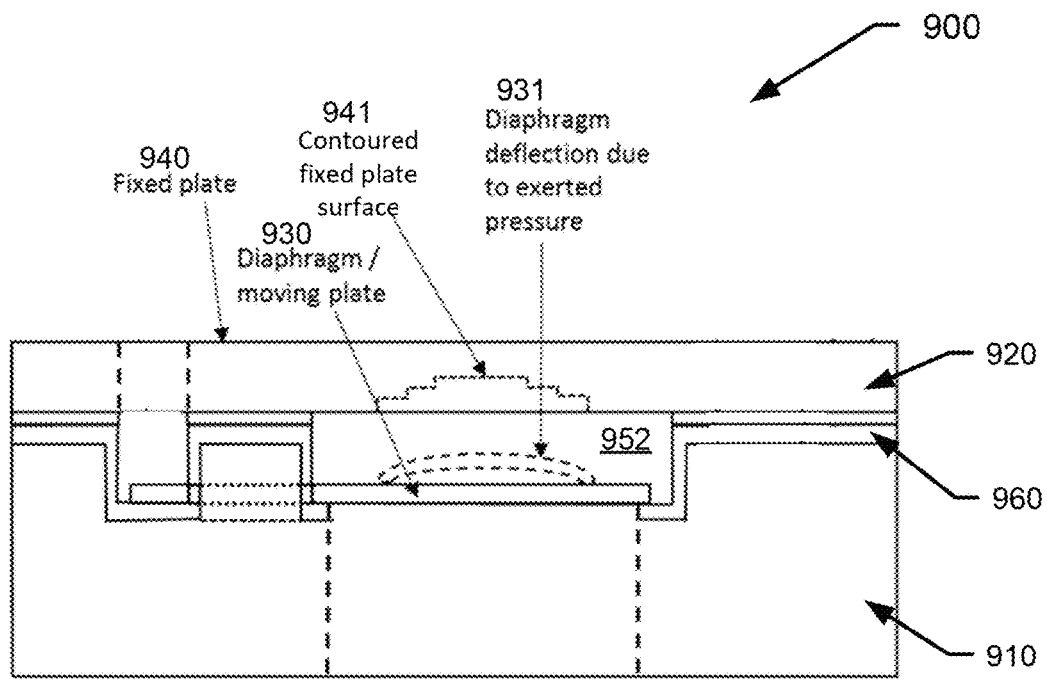
FIG. 9 shows a capacitive pressure sensor according to an example of the disclosure.

FIG. 9 shows a capacitive pressure sensor 900 according to an example of the disclosure. The capacitive pressure sensor 900 has a structure similar to that of the capacitive pressure sensor 100 in FIG. 1 example. For example, the capacitive pressure sensor 900 includes a first substrate 910, a second substrate 920, an isolation layer 960, a fixed plate 940, and a diaphragm 930 that are similar to their counterparts in FIG. 1. The diaphragm 930 is recessed into the first substrate 910. However, different from FIG. 1 example, the capacitive pressure senor 900 implements the feature of contoured cavity described herein. Specifically, the fixed plate 940 is contoured and includes a contoured surface 941 facing the diaphragm 930. The contoured surface 941 concaves into the fixed plate 940 and follows a deflection contour 931 of the diaphragm 930. In this way, a contoured cavity 952 is formed between the fixed plate 940 and the diaphragm 930.

Figure 10:
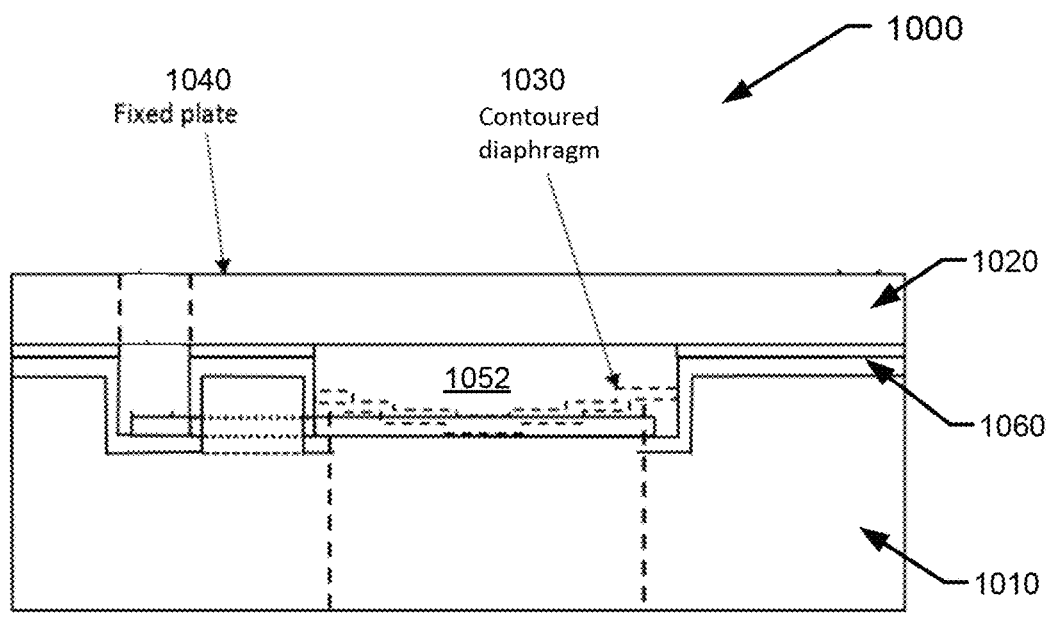
FIG. 10 shows another capacitive pressure sensor according to an example of the disclosure.

FIG. 10 shows another capacitive pressure sensor 1000 according to an example of the disclosure. The capacitive pressure sensor 1000 has a structure similar to that of the capacitive pressure sensor 100 in FIG. 1 example. For example, the capacitive pressure sensor 1000 includes a first substrate 1010, a second substrate 1020, an isolation layer 1060, a fixed plate 1040, and a diaphragm 1030 that are similar to their counterparts in FIG. 1. The diaphragm 1030 is recessed into the first substrate 1010. However, different from FIG. 1 example, the capacitive pressure senor 1000 implements the feature of contoured cavity described herein.

Different form the FIG. 9 example, in the capacitive pressure sensor 1000, the diaphragm 1030 is contoured instead of the fixed plate 1040. Specifically, the contoured diaphragm 1030 concaves in a direction away from the fixed plate 1040. In this way, a contoured cavity 1052 is formed between the fixed plate 1040 and the contoured diaphragm 1030. The feature of the contoured diaphragm 1030 in FIG. 10 has an effect similar to the feature of contoured fixed diaphragm 940, and leads to similar advantages described above.

It is noted that, although the technique of forming a contoured fixed plate or a contoured diaphragm is described with reference to bottom-mount configuration examples in FIGS. 9 and 10, the technique can also be applied to top-mount capacitive pressure sensors.

Figure 11:
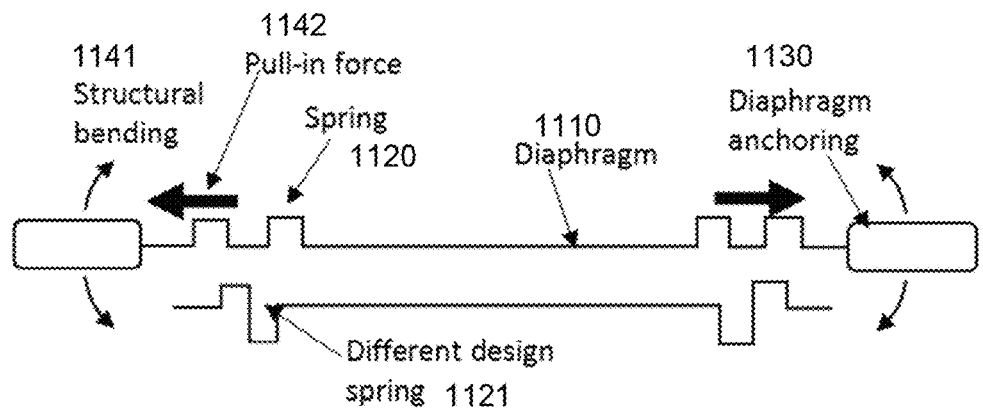
FIG. 11 shows a diaphragm in a capacitive pressure sensor according to an example.

FIG. 11 shows a diaphragm 1110 in a capacitive pressure sensor according to an example. The diaphragm 1110 includes a spring structure 1120, and is anchored to a diaphragm anchoring element 1130 through the spring structure 1120. The spring structure 1120 can buffer or reduce stress imposed on diaphragm 1110 from the anchoring element 1130. For example, structuring bending 1141 of the anchoring element 1130 may cause pull-in forces 1142. The pull-in forces 1142 at different locations with respect to the diaphragm 1110 may have different directions or magnitudes, which may cause mechanical deformation of the diaphragm 1110. As described above, the mechanical deformation can significantly affect performance of a capacitive pressure sensor, for example, reducing sensitivity of the capacitive pressure sensor. Due to the introduction of the spring structure 1120, sensitivity of the capacitive pressure sensor using the diaphragm 1110 can be improved. Spring structures for anchoring a diaphragm in a capacitive sensor can have various suitable forms. FIG. 11 also shows another different design 1121 of a spring structure for anchoring a diaphragm.

Figure 12:
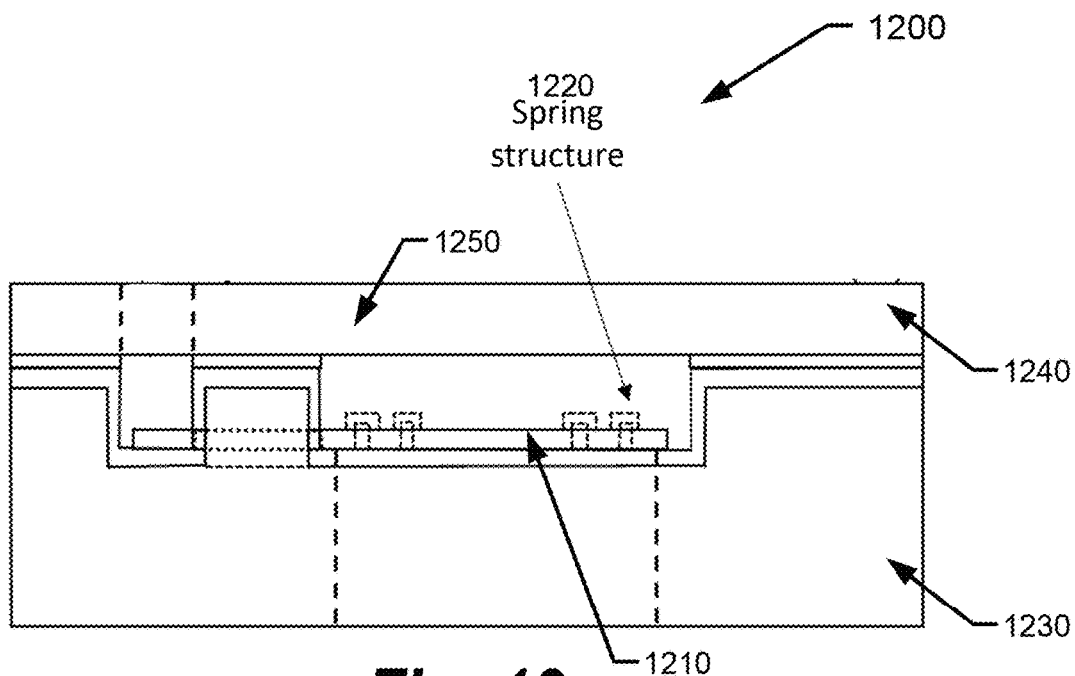
FIG. 12 shows a capacitive pressure sensor according to an example.

FIG. 12 shows a capacitive pressure sensor 1200 according to an example. The capacitive pressure sensor 1200 has a structure similar to the examples shown in FIGS. 1 and 2. For example, the capacitive pressure sensor 1200 can include a first substrate 1230 and a second substrate 1240 bonded together. The second substrate 1240 includes a fixed block 1250, while the first substrate 1230 includes a diaphragm 1210 recessed into the first substrate 1230. However, different from the FIG. 1 or FIG. 2 example, the diaphragm 1210 includes a spring structure 1220. The spring structure 1220 is similar to the spring structure 1120 in terms of structure and function.

In various examples, the diaphragm 1210 and spring structure 1220 can have different configurations and structures. In one example, the diaphragm 1210 has a circular shape, and the spring structure 1220 is formed at a ring-shaped region near the edge of the diaphragm 1210. In another example, one or more portions of the edge of the diaphragm 1210 is anchored to the first substrate 1230 through one or more respective spring structures, thus the diaphragm 1210 is floating or suspended.

Figure 13:
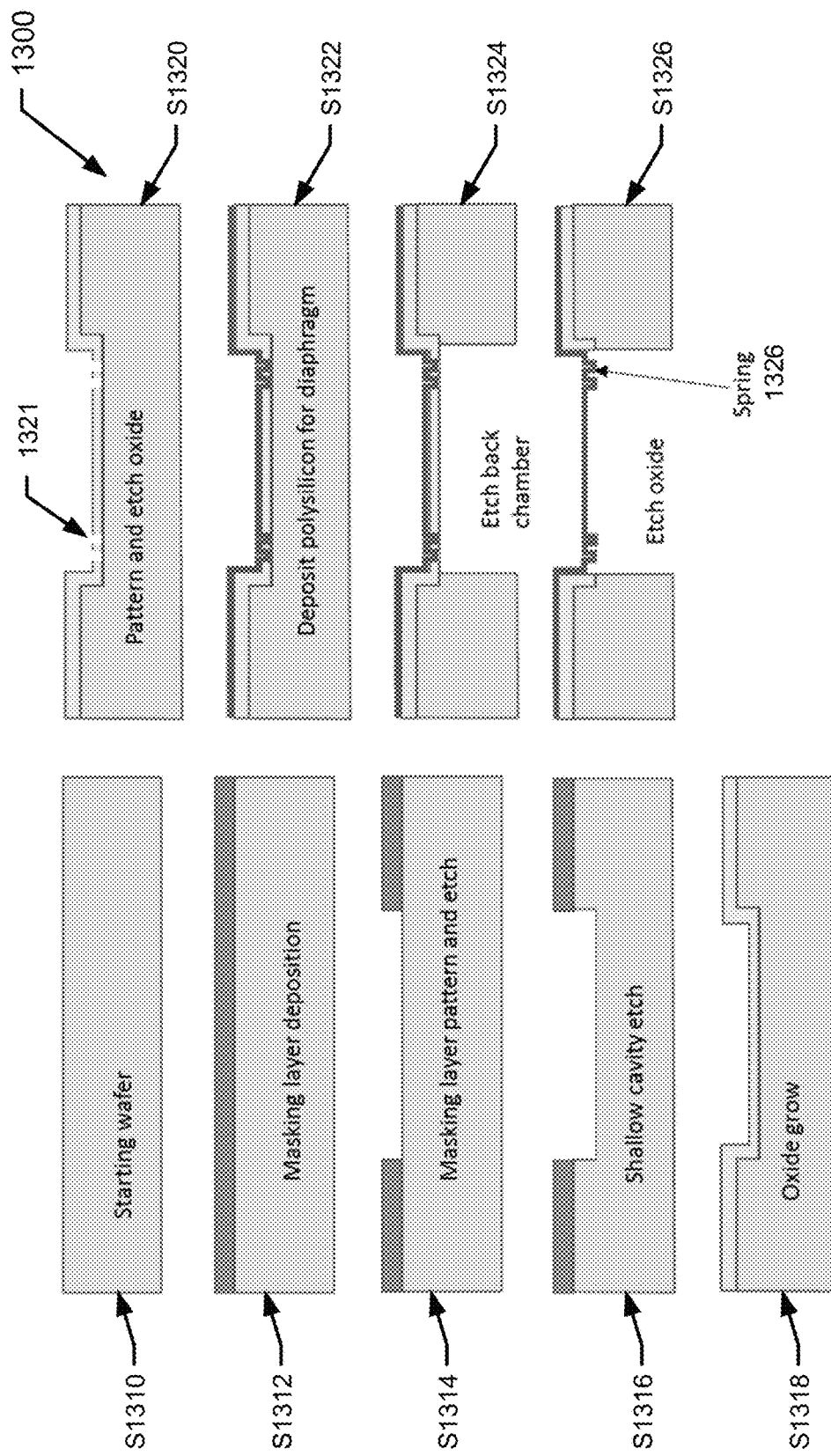
FIG. 13 shows a fabricating process for forming a spring structure according to an example.

FIG. 13 shows a fabricating process 1300 for forming a spring structure according to an example. The fabricating process 1300 can be employed to manufacture capacitive pressure sensors having a spring structure, such as the capacitive pressure sensor 1200 in FIG. 12. The fabricating process 1300 includes a sequence of steps S1310-S1326.

At S1310, a wafer is provided. FIG. 13 shows a portion of the wafer for making one capacitive pressure sensor. The portion corresponds to a first substrate in a capacitive sensor. At S1312, a masking layer is deposited over the wafer. At S1314, the masking layer is patterned and etched. At S1316, a recessed cavity is formed by etching into the substrate. At S1318, a layer of silicon oxide is grown over the substrate. At S1320, the layer of silicon oxide is patterned and etched to form grooves 1321. At S1322, a polysilicon layer is deposited over the layer of silicon oxide to form a diaphragm. At S1324, a back chamber is formed below the layer of silicon oxide. At S1326, the layer of silicon oxide is etched away, and a spring structure 1326 is formed.

Figure 14:
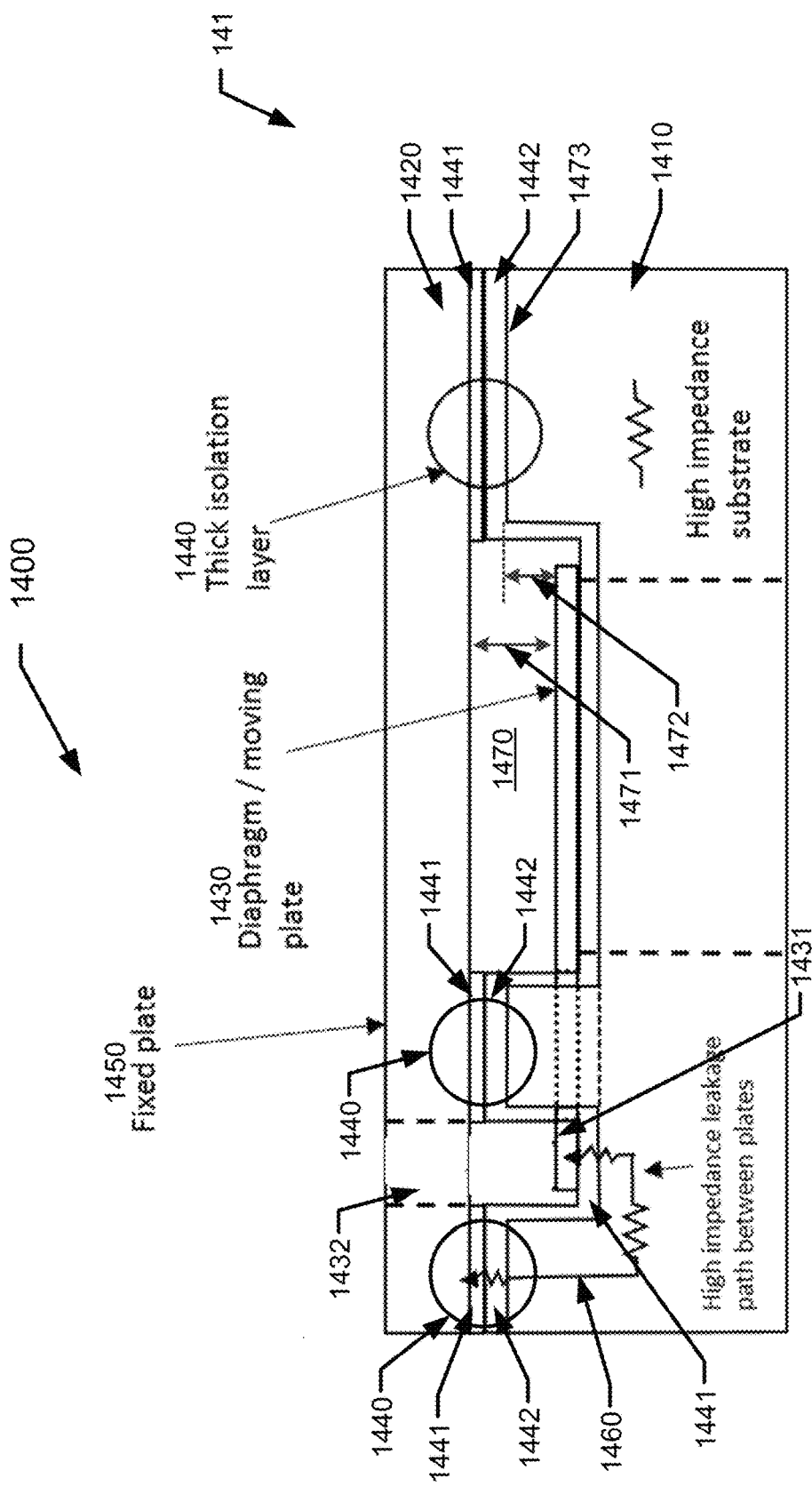
FIG. 14 shows a capacitive pressure sensor including a thick isolation layer according to an example.

FIG. 14 shows a capacitive pressure sensor 1400 including a thick isolation layer 1440 according to an example. The capacitive pressure sensor 1400 has structures and functions similar to that of the capacitive pressure sensor 100 in FIG. 1 example. For example, the capacitive pressure sensor 1400 includes a first substrate 1410 and a second substrate 1420 bonded together. The second substrate 1420 includes a fixed plate 1450, while the first substrate 1410 includes a diaphragm 1430 recessed into the first substrate 1410.

In particular, the capacitive pressure sensor 1400 includes an isolation layer 1440 at the bonding interface between the first and second substrates 1410/1420. The isolation layer 1440 can insulate the first substrate 1410 from the second substrate 1420, such that leakage current between the first and second substrates 1410/1420 can be reduced or eliminated. In one example, the isolation layer 1440 is formed with a thickness that can significantly reduce the leakage current between the first and second substrate 1410/1420. In one example, the thickness of the isolation layer satisfies the requirement of capacitance of the capacitor formed by the diaphragm 1430 and the fixed plate 1450. For example, the capacitance is determined by a distance 1471 between the diaphragm 1430 and the fixed plate 1450 which is equal to the thickness of the isolation layer plus a depth 1472 of a cavity 1470 below the fixed plate. The depth 1472 is between a surface 1473 of the first substrate 140 and the upper surface of the diaphragm 1430. Accordingly, a thickness of the isolation layer 1440 can be determined based on the capacitance wherein capacitance is equal to the area of the plate divided by the distance. In one example, the depth 1472 is designed to be small with respect to the distance 1471 such that the thickness of the isolation layer 1440 can be increased as a higher thickness of the isolation layer 1440 resulting in better noise performance. In an example, the isolation layer 1440 includes multiple layers of insulating materials, such as a first layer 1441 and a second layer 1442 of insulating materials. For example, the first layer 1441 can be a silicon oxide adhesive layer, and the second layer 1441 can be a silicon oxide layer deposited before forming the diaphragm 1430. In one example, the isolation layer 1440 includes a layer of silicon dioxide.

FIG. 14 also shows a current leakage path 1460. The leakage path 1460 starts from a portion 1431 of the diaphragm 1430, and passes through the isolation layer 1441 into the first substrate 1410. In one example, the first substrate 1410 is formed by a material having a high impedance. Then, leakage path 1460 passes through the isolation layer 1440 into the second substrate 1420. As shown, due to the isolation effect of the isolation layers 1440 and 1441 as well as the high impedance of the first substrate 1410, the leakage current between the diaphragm 1430 and the fixed plate 1450 can be significantly reduced.

A leakage current between a diaphragm and a fixed plate in a capacitive pressure sensor causes acoustic noise to a sensor signal generated from the capacitive pressure sensor, and can decrease signal to noise ratio (SNR) of the capacitive pressure sensor. Due to the specific structure (the diaphragm 1430 is recessed into the first substrate 1410) and the accordingly formed isolation layer 1440, the leakage current of the capacitive pressure sensor 1400 can be significantly reduced, leading to a high SNR of the capacitive pressure sensor 1400. In one example, a capacitive pressure sensor similar to the example in FIG. 14 can have a SNR of above −70 dB.

In addition, as a larger capacitor can be employed to produce a larger sensor signal to increase a SNR, a larger die size is typically required in order to obtain a higher SNR. Due to the above isolation structure that leads to a lower acoustic noise level and a higher SNR, a same SNR can be obtained without enlarging the die size. Cost incurred by a larger die size can thus be avoided.

Figure 15:
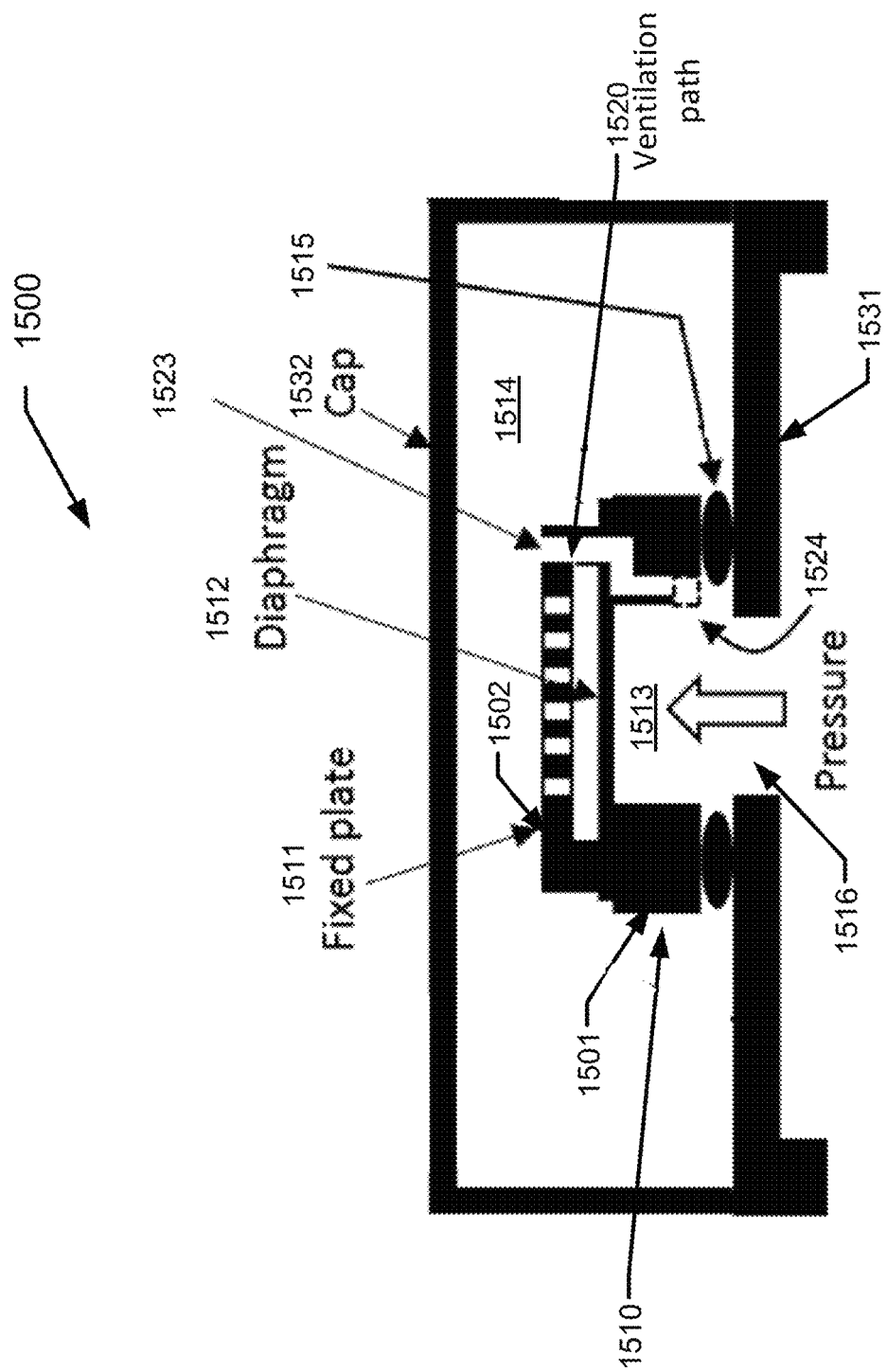
FIG. 15 shows a capacitive pressure sensor package according to an example.

FIG. 15 shows a capacitive pressure sensor package 1500 according to an example. The package 1500 includes a package substrate 1531 and a cap 1532 mounted over the package 1531 enclosing a capacitive pressure sensor 1510. The capacitive pressure sensor 1510 has a structure similar to that of the FIG. 1 example. Specifically, the capacitive pressure sensor 1510 has a first substrate 1501 and a second substrate 1502. The second substrate 1502 includes a fixed plate 1511 and the first substrate 1501 includes a recessed diaphragm 1512. The capacitive pressure sensor 1510 is of a bottom-mount sensor, and is mounted to the package substrate 1531 with adhesive materials 1515. A back chamber 1513 is formed below the diaphragm 1512 and connected with a pressure port 1516 created on the package substrate 1531. A chamber 1514 is formed between the cap 1532 and the capacitive pressure sensor 1510.

Particularly, a ventilation path 1520 is formed connecting the chamber 1514 with the back chamber 1513. Consequently, a reference pressure equal to the atmospheric pressure is provided to the chamber 1514, such that either side of the diaphragm 1512 is exposed to a same air pressure, which enables the capacitive pressure sensor 1510 to operate in a gauge measurement mode.

In one example, the ventilation path 1520 includes a first opening 1523 at a surface of the second substrate 1502 facing the chamber 1514 and a second opening 1524 at a side wall of the back chamber 1513. The ventilation path 1520 goes through the first substrate 1501 and the second substrate 1502 subsequently as shown in FIG. 15. In addition, the ventilation path 1520 is configured to have a certain length such that a phase shift can be created between sound waves reaching different sides of the diaphragm 1512 from a same source. In this way, the capacitive pressure sensor 1510 can operate properly for dynamic pressure applications, such as a microphone.

Figure 16B:
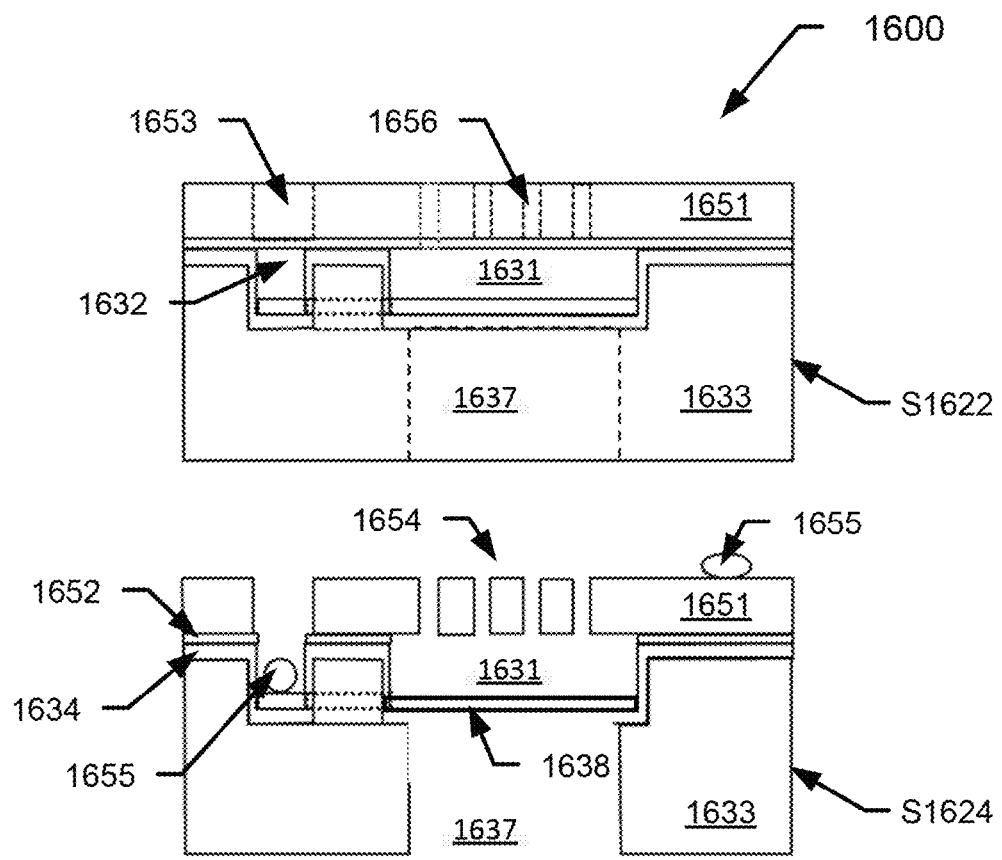

FIGS. 16A-16B show a fabricating process 1600 according to an example. The fabricating process 1600 can be employed to fabricate a bottom-mount capacitive pressure sensor, such as the example capacitive pressure sensor 100 in FIG. 1. The fabricating process 1600 can include a sequence of steps S1610-S1624.

At S1610, a cavity 1631 and a first via hole 1632 is etched into a first substrate 1633. Specifically, the cavity 1631 is recessed into the first substrate 1633 from a first surface 1630 of the first substrate 1633. At S1612, a first isolation layer 1634, for example, made of silicon dioxide, is grown on surface of the first substrate 1633 including the surface of the cavity 1631. At S1614, a diaphragm layer 1635, for example, made of polysilicon, is deposited is on the bottoms of the cavity 1631 and the first via hole 1632. It is noted that materials for forming the diaphragm layer 1631 is not limited to polysilicon. In alternative examples, materials other than polysilicon can be used for the layer 1631, such as silicon carbide, and the like. The two portions of the diaphragm layer 1631 at the bottoms of the cavity 1631 and the first via hole 1632 are connected through a deposited polysilicon layer at a channel 1636

At S1618, a second substrate 1651 is bonded to the first substrate 1633 over the first surface 1630 of the first substrate 1633. The bonding operation can be fusion bonding or bonding using adhesive materials. In one example, fusion bonding is used. In one example, a second isolation layer 1652 of silicon oxide is formed before the boding operation. In order to achieve enhanced isolation effect between the first and second substrates 1651 and 1633, the thickness of the second isolation layer 1652 can be increased to obtain better isolation.

At S1620, the second substrate 1651 is ground down to desired thickness. At S1622, damping holes 1656 are etched above the cavity 1631, and a second via hole 1653 is etched above the first via hole 1632. In addition, a back chamber 1637 is etched below the cavity 1631. At S1624, part of the first and second isolation layers are removed. Specifically, portions of the second isolation layer 1652 above the cavity 1631 and the first via hole 1632 are removed, and a portion of the first isolation layer 1624 below the cavity 1631 is removed. Accordingly, a movable diaphragm 1638 and a fixed plate 1654 are formed, which together form a capacitor for pressure measurement. In addition, metals 1655 are deposited to respective locations to form contacts for electrical interconnections.

The first and second substrates 1633 and 1651 can be formed with prime grade (device grade) wafer or test grade wafer, both of which are cheaper than SOI wafer. As a result, a capacitive pressure sensor having a design and structure of FIG. 1 example and fabricated with the fabricating process 1600 can have a lower cost compared with a conventional capacitive pressure sensor similar to FIG. 4 example where SOI wafers are employed.

It is noted that the above described process 1600 can include other additional fabricating steps not shown in FIGS. 16A-16B. For example, the process 1600 can include steps for creating concaved diaphragm or concaved fixed block to form a concaved cavity between the diaphragm and the fixed block in order to obtain advantages of respective designs as described above. In addition, the steps of the process 1600 may be performed in an order different from the example shown in FIGS. 16A-16B in other examples to realize the same results.

Figure 17A:
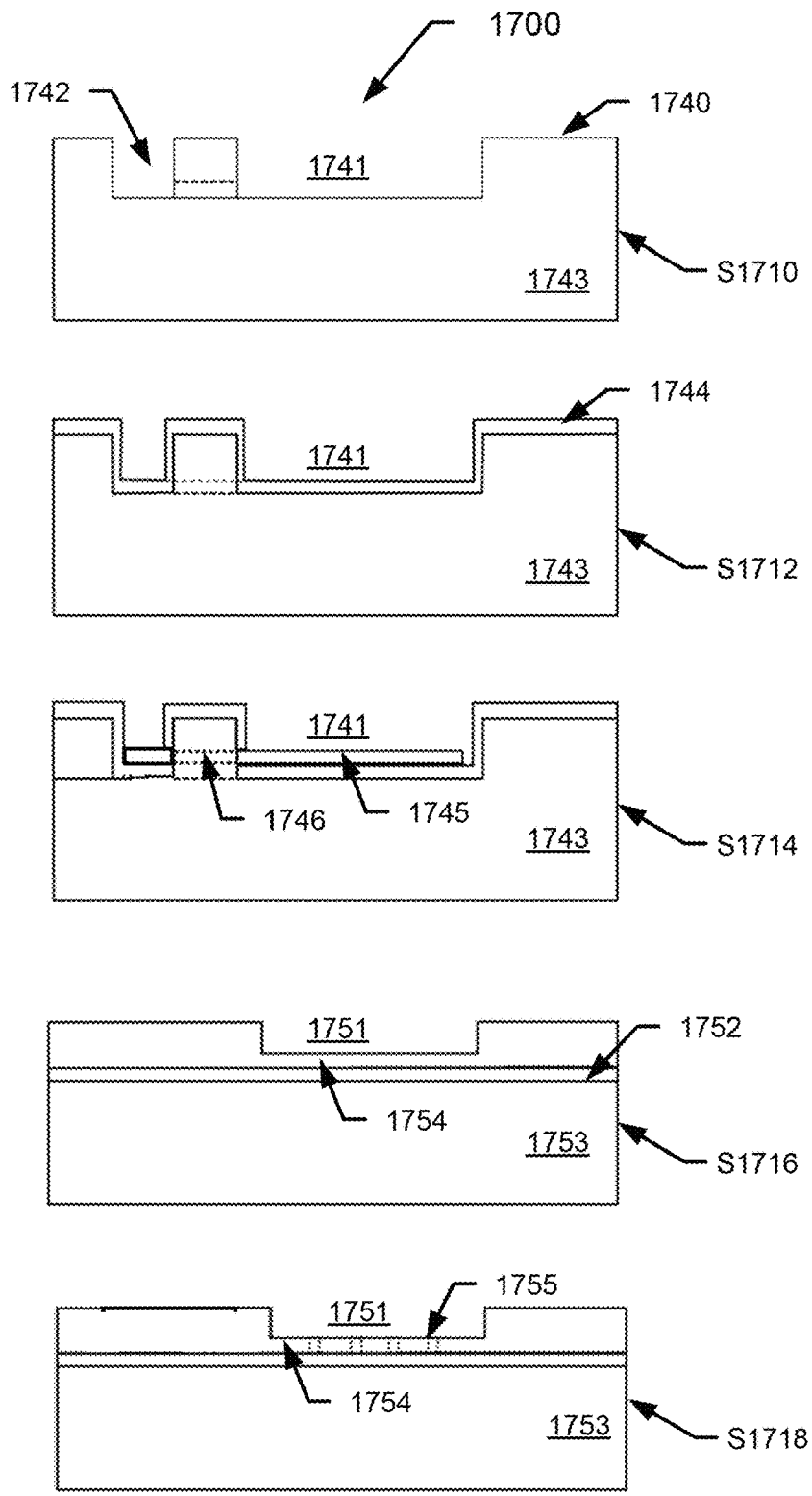
FIGS. 17A-17B show another fabricating process according to an example.
Figure 17B:
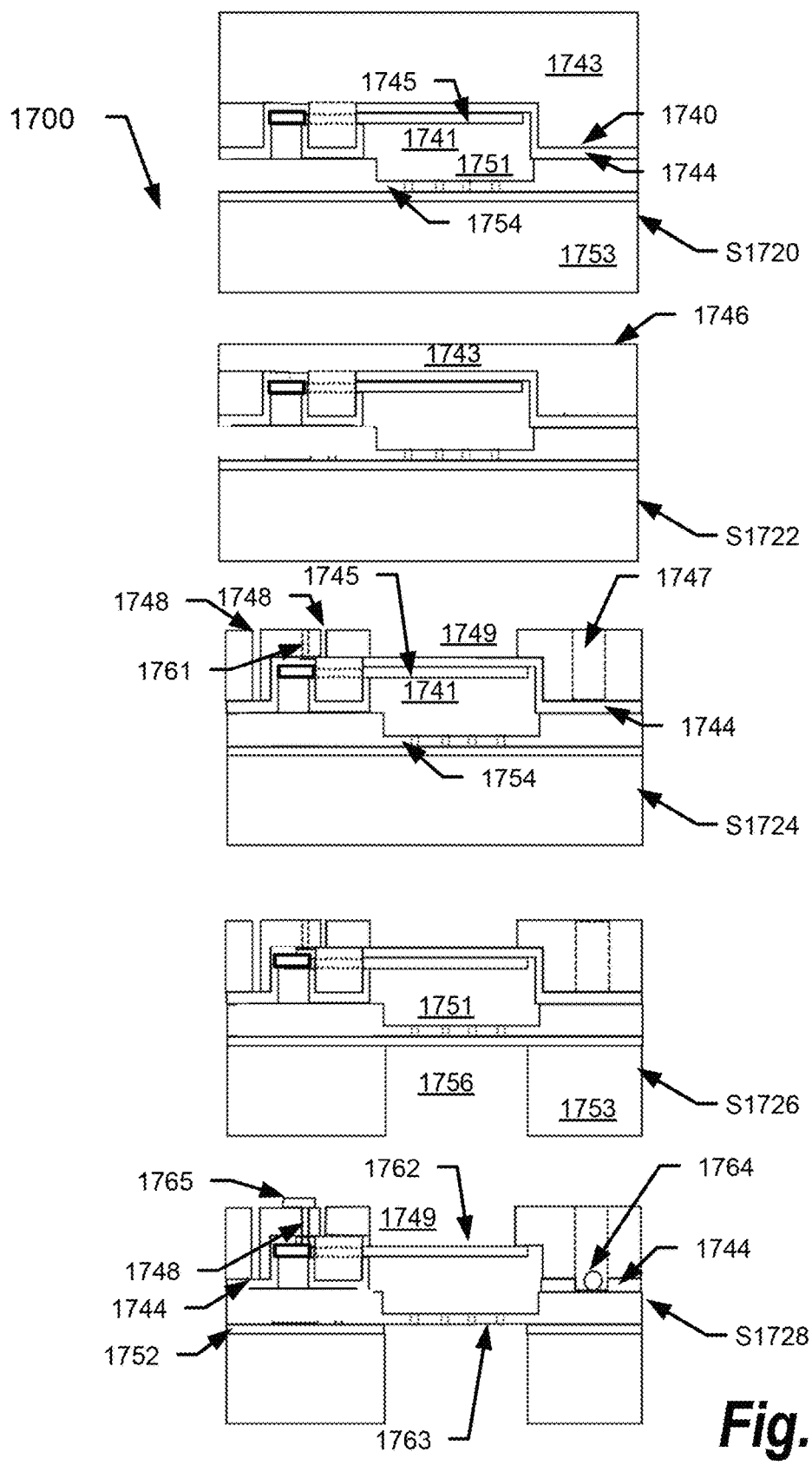

FIGS. 17A-17B show a fabricating process 1700 according to an example. The fabricating process 1700 can be employed to fabricate a top-mount capacitive pressure sensor, such as the example capacitive pressure sensor 200 in FIG. 2. The fabricating process 1700 can include a sequence of steps S1710-S1728.

At S1710, a cavity 1741 and an opening 1742 is etched into a first substrate 1743. Specifically, the cavity 1741 is recessed into the first substrate 1743 from a first surface 1740 of the first substrate 1743. At S1712, a first isolation layer 1744, for example, made of silicon dioxide, is grown on surface of the first substrate 1743 including the surface of the cavity 1741. At S1714, a diaphragm layer 1745, for example, made of polysilicon, is deposited is on the bottoms of the cavity 1741 and the opening 1742. It is noted that materials for forming the layer 1745 is not limited to polysilicon. In alternative examples, materials other than polysilicon can be used for the diaphragm layer 1745, such as silicon carbide, and the like. The two portions of the diaphragm layer 1745 at the bottoms of the cavity 1741 and the opening 1742 are connected through a channel 1746.

At S1716, a cavity 1751 is formed, for example, by etching, on a second substrate 1753. In one example, the second substrate 1753 is a portion of a silicon on insulator (SOI) wafer, and accordingly includes a second isolation layer 1752. In one example, the second isolation layer 1752 is formed by a layer of silicon dioxide. As a result of S1716, a fixed plate layer 1754 is formed between bottom of the cavity 1741 and the second isolation layer 1752. At S1718, damping holes 1755 are formed in the fixed plate layer 1754.

At S1720, the first substrate 1743 is bonded to the second substrate 1753 with the cavity 1741 adjacent to the cavity 1751. A gap including the cavities 1741 and 1751 is formed between the fixed plate layer 1754 and the layer 1745. As shown, the first isolation layer 1744 is located between the first and second substrates 1743 and 1753 insulating the first substrate 1743 from the substrate 1753.

At S1722, the first substrate 1743 is reduced from a second surface 1746. At S1724, a first via hole 1747 for electrical interconnection to the fixed plate layer 1754, and a second via hole 1761 for electrical interconnection to the diaphragm layer 1745 are formed. In addition, a cavity 1749 besides the first isolation layer 1744 opposite to the first cavity 1741 is formed. Further, openings 1748 for forming an isolation wall surrounding the via hole 1761 are formed.

At S1726, a back chamber 1756 (a cavity) is formed below the cavity 1751 in the second substrate 1753. At S1728, part of the first and second isolation layers 1744 and 1752 is removed. Specifically, a portion of the first isolation layer 1744 at the bottom of the cavity 1749 is removed to form a movable diaphragm 1762, while a portion of the second isolation layer 1752 below the fixed plate layer 1754 is removed to form a fixed plate 1763. The diaphragm 1762 and the fixed plate 1764 form a capacitor for pressure measurement. In addition, portions of the first isolation layer 1744 at bottom of the via holes 1764 and 1765 are removed. Further, metallization is performed to form bonding pad 1765 and contact 1764 corresponding to the diaphragm 1762 and the fixed plate 1763, respectively. The bonding pad 1765 is connected to the diaphragm layer 1745 through the via hole 1748.

The first substrate 1743 can be formed with prime grade (device grade) wafer or test grade wafer. In addition, the above described process 1700 can include other additional fabricating steps not shown in FIGS. 17A-17B. For example, the process 1700 can include steps for creating concaved diaphragm or concaved fixed block to form a concaved cavity between the diaphragm and the fixed block in order to obtain advantages of respective designs as described above. In addition, the steps of the process 1700 may be performed in an order different from the example shown in FIGS. 17A-17B in other examples to realize the same results.

Figure 18:
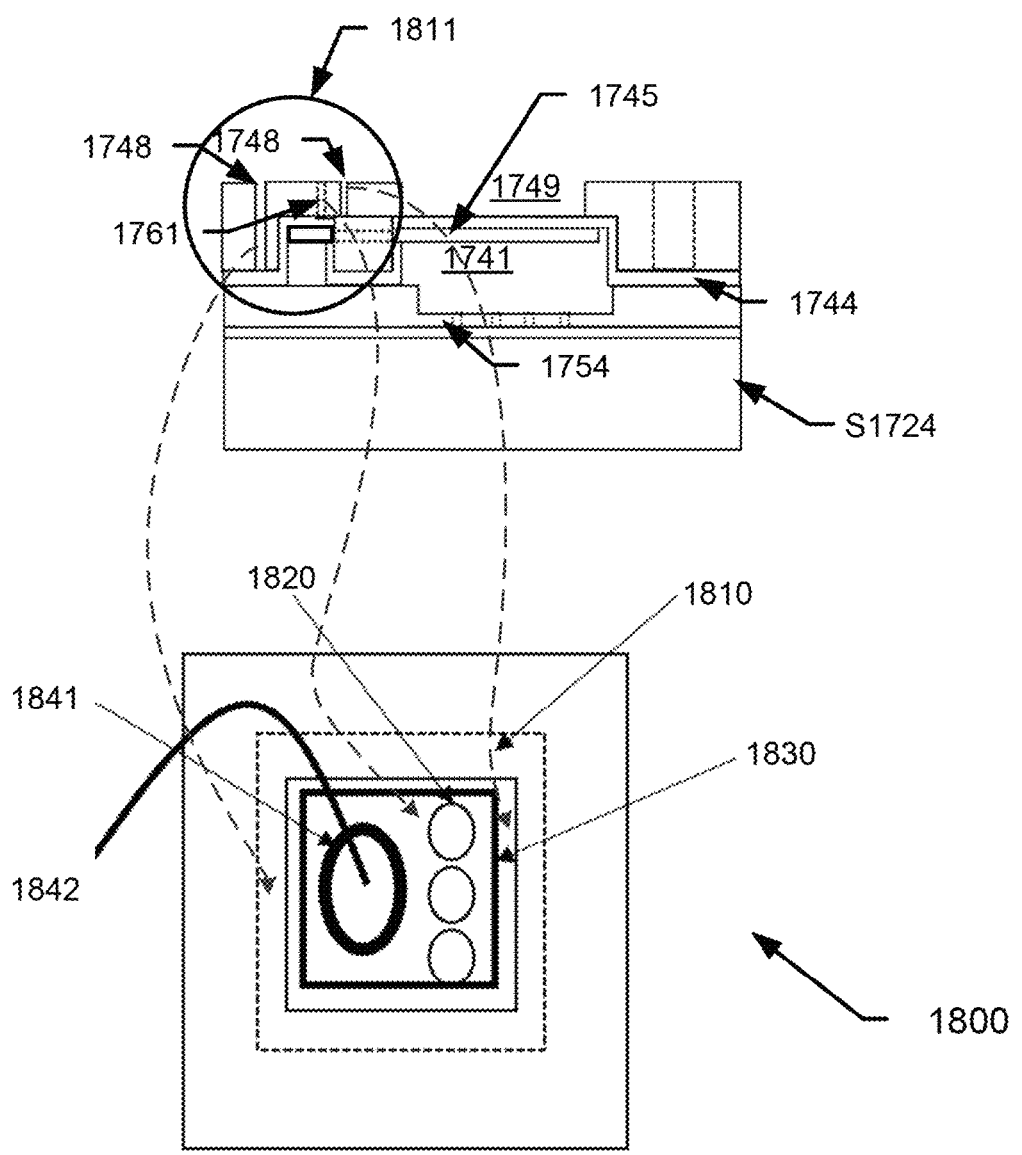
FIG. 18 shows a contact structure for providing electrical interconnection to a diaphragm according to an example.

FIG. 18 shows a contact structure 1800 for providing electrical interconnection to a diaphragm according to an example. The contact structure 1800 is explained with reference to the figure corresponding to S1724 in FIG. 17B (referred to as FIG. S1724 below) which is copied and shown in FIG. 18. The contact structure 1800 can include one or more via holes 1820 formed for interconnection to the diaphragm 1745. The via hole 1761 in FIG. S1724 corresponds to one of such via holes 1820. The contact structure 1800 can further include an isolation wall 1810 surrounding the via holes 1820. The isolation wall 1810 is formed by insulating materials. The openings 1748 in FIG. S1724 correspond to the left and right side of the isolation wall 1810. As shown in FIG. S1724, the isolation wall 1810 and the first isolation layer 1744 form an isolation well 1811 insulating contact structures inside the isolation well 1811 from regions outside the isolation well 1811. The contact structure 1800 can further includes a bonding pad 1830, for example, formed by an aluminum metallization process. The bonding pad 1830 is connected with the diaphragm layer 1745 through the via holes 1820. In one example, a wire bond 1841 can connect to the bonding pad 1830 through a ball bonding process.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A capacitive pressure sensor, comprising:
   a first substrate;
   a second substrate;

a movable plate disposed between a first cavity recessed into the first substrate and a second cavity recessed into the first substrate; and a ventilation path including a first opening at a sidewall of the second cavity and a second opening at a surface of the second substrate opposite to a bonding interface between the first and second substrates, the ventilation path going through the first substrate and the second substrate, wherein the second substrate is bonded to the first substrate and includes a fixed plate disposed over the first cavity and the movable plate to form a capacitor.

2. The capacitive pressure sensor of claim 1, wherein the fixed plate has a contoured surface facing the movable plate, the contoured surface corresponding to a deflection contour of the movable plate.

3. The capacitive pressure sensor of claim 1, wherein the movable plate is contoured and concaves in a direction away from the fixed plate.

4. The capacitive pressure sensor of claim 1, wherein the movable plate includes a spring structure disposed near an edge of the movable plate and configured to reduce stress on the movable plate.

5. The capacitive pressure sensor of claim 1, further comprising: an isolation layer at a bonding interface between the first substrate and the second substrate.

6. A capacitive pressure sensor package, comprising: the capacitive pressure sensor of claim 1;

a package substrate including an opening, wherein the first substrate is attached to the package substrate with the second cavity over the opening; and a cap attached to the package substrate to enclose the first substrate and the second substrate.

7. A process for fabricating a capacitive pressure sensor, comprising:

forming a first cavity recessed into a first substrate from a first surface of the first substrate;

forming a first isolation layer over the first surface of the first substrate and a surface of the first cavity;

forming a diaphragm layer at the bottom of the first cavity over the first isolation layer; and bonding a second substrate to the first substrate over the first surface of the first substrate.

8. The process of claim 7, further comprising:
reducing the second substrate; and
forming damping holes in the second substrate over the first cavity.

9. The process of claim 8, further comprising:
forming a second cavity in the first substrate between the first isolation layer and a second surface of the first substrate; and removing a portion of the first isolation layer between the diaphragm layer and the second cavity.

10. The process of claim 9, further comprising:
forming a second isolation layer over a bonding surface of the second substrate before bonding the second substrate with the first substrate; and removing a portion of the second isolation layer above the first cavity after forming the second cavity.

11. The process of claim 9, further including:
attaching the first substrate to a package substrate at the second surface of the first substrate, wherein the package substrate has an opening disposed below the second cavity; and attaching a cap to the package substrate to enclose the first substrate and the second substrate.

12. The process of claim 7, wherein bonding the second substrate to the first substrate includes fusion bonding the second substrate to the first substrate.

13. The process of claim 7, wherein the diaphragm layer is constructed with silicon oxide or silicon carbide.

14. The process of claim 7, wherein the first substrate is a portion of a prime wafer or a test wafer, and the second substrate is a portion of a prime wafer or a test wafer.

* * * * *